(12) United States Patent
Watanabe et al.

(10) Patent No.: US 6,887,778 B2
(45) Date of Patent: May 3, 2005

(54) SEMICONDUCTOR DEVICE AND MANUFACTURING METHOD

(75) Inventors: Masako Watanabe, Oita (JP); Mutsumi Masumoto, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 1 day.

(21) Appl. No.: 10/253,339

(22) Filed: Sep. 24, 2002

(65) Prior Publication Data
US 2003/0068847 A1 Apr. 10, 2003

(30) Foreign Application Priority Data
Sep. 25, 2001 (JP) ........................................ 2001-292042

(51) Int. Cl.$^7$ .............................................. H01L 21/44
(52) U.S. Cl. ........................ 438/613; 438/612; 438/108
(58) Field of Search ........................... 348/106; 257/778

(56) References Cited

U.S. PATENT DOCUMENTS 6,372,547 B2 * 4/2002 Nakamura et al. .......... 438/118

2002/0003299 A1 * 1/2002 Nakamura et al. .......... 257/734

* cited by examiner

Primary Examiner—Hoai Ho
Assistant Examiner—Thao P. Le
(74) Attorney, Agent, or Firm—Wade James Brady, III; Frederick J. Telecky, Jr.

(57) ABSTRACT

A semiconductor device and its manufacturing method with which the connection reliability can be improved without complicating the manufacturing process. Semiconductor chip 102 is mounted on the principal surface of insulated substrate 104, and a conductive paste containing a heat-curing epoxy resin is supplied to via holes 116 from the back of insulated substrate 104. Then, solder balls 118 are transferred onto the conductive paste of insulated substrate 104, and reflow soldering is applied in order to bond solder balls 118 to insulated substrate 104. During the reflow soldering, the heat-curing epoxy resin forms resin parts 120 around solder balls 118.

9 Claims, 6 Drawing Sheets

SEMICONDUCTOR DEVICE AND MANUFACTURING METHOD

This application claims priority from Japanese patent application number 2001-292042, filed Sep. 25, 2001.

FIELD OF THE INVENTION

The present invention pertains to a semiconductor device and its manufacturing method.

BACKGROUND OF THE INVENTION

In recent years, as semiconductor devices have enhanced their operations and performance, semiconductor packages have become miniaturized. To achieve this miniaturization, so-called BGA (Ball Grid Array) packages, in which solder balls serving as external connection terminals are attached on the bottom surface of a semiconductor package, are being developed. In the case of this BGA package, a semiconductor chip is mounted on the principal surface of an insulated substrate, and solder balls are attached to the rear surface. Conductor patterns to be connected to the semiconductor chip via wires are formed on the principal surface of the insulated substrate, and the solder balls are connected to said conductor patterns through via holes formed on the insulated substrate.

SUMMARY OF INVENTION

In order to improve the reliability of the electrical connection (referred to as electrical reliability, hereinafter) in the semiconductor package, the solder balls and the conductor patterns must be joined more securely. Thus, it has been suggested that after the semiconductor package is attached to a motherboard (printed-wiring board), a resin called an underfill be supplied between the semiconductor package and the motherboard. However, supplying the underfill during post-processing not only complicates the production process but also makes supplying the underfill more difficult since the solder balls are more densely arranged.

In addition, a structure called a flip-chip, in which a semiconductor chip is mounted directly on the motherboard, has also been suggested in recent years. In the case of said flip-chip structure, solder bumps serving as external connection terminals are formed on electrode pads formed on the surface of the semiconductor chip. In the case of a semiconductor chip of said type, the solder bumps and the electrode pads must be joined more securely in order to improve the connection reliability. Thus, there is great demand for developing a technology for improving the connection reliability without complicating the production process.

Therefore, the purpose of the present invention is to present a semiconductor device and its manufacturing method with which the connection reliability can be improved but without complicating the production process.

In order to achieve the aforementioned objective, the semiconductor device of the present invention is provided with an insulated substrate having multiple via holes and multiple conductor patterns in contact with the aforementioned via holes on the principal surface side, a semiconductor chip mounted on the principal surface of the aforementioned insulated substrate, a connecting element for achieving electrical connection between electrode pads of the aforementioned semiconductor chip and the aforementioned conductor patterns, multiple external connection terminals formed at the positions on the rear side of the aforementioned insulated substrate corresponding to the aforementioned via holes and electrically connected to the aforementioned conductor patterns, and resin parts formed at the periphery parts of the aforementioned external connection terminals using a heat-curing epoxy resin.

In addition, the semiconductor device of the present invention is provided with a semiconductor chip in which an electric circuit and electrode pads are formed on the principal surface, an insulating resin layer formed on the principal surface side of the aforementioned semiconductor chip, external connection terminals formed on the aforementioned insulating resin layer and electrically connected to the aforementioned electrode pads, and resin parts formed at the periphery of the aforementioned external connection terminals using a heat-curing epoxy resin.

The method for manufacturing a semiconductor device of the present invention involves a step in which an insulated substrate having multiple via holes for providing external connection terminals and multiple conductive patterns in contact with the aforementioned via holes on the principal surface side is prepared, a step in which a semiconductor chip is mounted on the principal surface side of the aforementioned insulated substrate, and electrical connection is achieved between electrode pads of the aforementioned semiconductor chip and the aforementioned conductive patterns, a step in which a conductive paste containing a heat-curing epoxy resin is supplied to the aforementioned via holes, and a heating step in which resin parts are formed at the periphery parts of the external connection terminals using the heat-curing epoxy resin contained in the aforementioned conductive paste.

As described above, when the conductive part containing the heat-curing epoxy resin is used, and heat treatment is applied in order for the heat-curing epoxy resin to form resin parts at the periphery of the external connection terminals during the formation of the external connection terminals, the external connection terminals can be reliably connected to the insulated substrate, so that the connection reliability in the semiconductor device can be improved. In addition, because the underfill supplying step during post-processing can be eliminated, the manufacturing process can be simplified.

Furthermore, in the present invention, it is desirable that a step for moving conductive balls serving as the aforementioned external connection terminals onto the aforementioned conductive paste also be provided, and that the aforementioned resin parts be formed at the periphery of the aforementioned conductive balls.

In addition, the method for manufacturing a semiconductor device of the present invention involves a step in which a semiconductor chip with an electric circuit and electrode pads formed on the principal surface side is prepared, a step in which an insulating resin layer is formed on the principal surface side of the aforementioned semiconductor chip, a step in which a conductive paste containing a heat-curing epoxy resin is supplied to the aforementioned insulated resin layer while forming electrical connections with the aforementioned electrode pads, and a heating step in which resin parts are formed at the periphery parts of the external connection terminals using the heat-curing epoxy resin contained in the aforementioned conductive paste.

In the present invention, it is desirable that the content of the heat-curing epoxy resin of the aforementioned conductive paste be between 10 wt % and 15 wt %, inclusive.

REFERENCE NUMERALS AND SYMBOLS AS SHOWN IN THE DRAWINGS

In the figures, 100 represents a semiconductor package, 102 a semiconductor chip, 104 an insulated substrate, 106 a sealing material, 108 an electrode pad, 116 a via hole, 118 a solder ball, 120 a resin part, 600 a semiconductor package, 602 a semiconductor chip, 604 an electrode pad, 606 an insulation film, 608 a wire, 610 a bump, 612 an electrode pad, 614 a solder ball, 616 a resin part, 900 a semiconductor chip, 902 a semiconductor substrate, 904 an electrode pad, 906 a solder bump, and 908 a resin part

DESCRIPTION OF THE EMBODIMENTS

Figure 1:
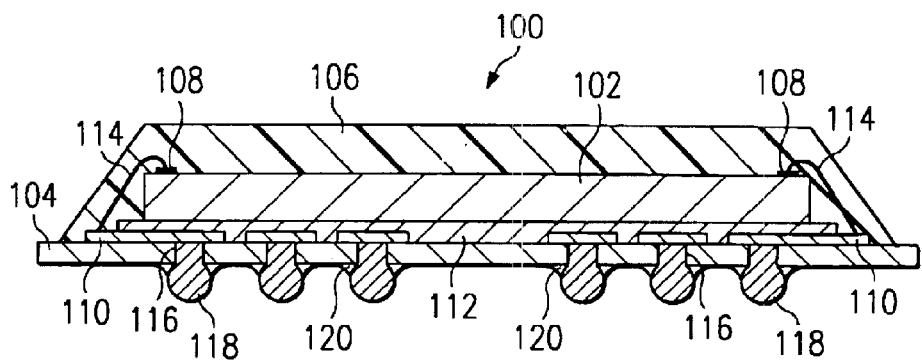
FIG. 1 is a cross section showing the structure of the semiconductor package pertaining to a first embodiment of the present invention.

The present invention will be explained in detail below with reference to an embodiment illustrated by the figures. FIG. 1 is a cross section showing the structure of semiconductor package 100 pertaining to a first embodiment of the present invention. Said semiconductor package 100 is called a BGA package provided with semiconductor chip 102 in which an integrated circuit is formed on the surface of an Si (silicon) substrate, insulated substrate 104 on which said semiconductor chip 102 is mounted, and sealing material 106 used to seal them. Electrode pads 108 led out from said integrated circuit are formed on the surface of semiconductor chip 102. Semiconductor chip 102 is bonded to the principal surface (top surface in the figure) of insulated substrate 104 via die paste 112 serving as a bonding agent. Conductive patterns 110 made of Cu are formed on the principal surface of insulated substrate 104 and connected to electrode pads 108 using conductive wires 114.

Insulated substrate 104 has via holes 116, that is, through-holes, formed at the positions corresponding to respective conductive patterns 110. Solder balls 118 serving as external connection terminals are attached to the rear surface of insulated substrate 104 at the positions corresponding to via holes 116. Solder balls 118 are joined to conductive patterns 110 via the solder filled in via holes 116.

Figure 2A:
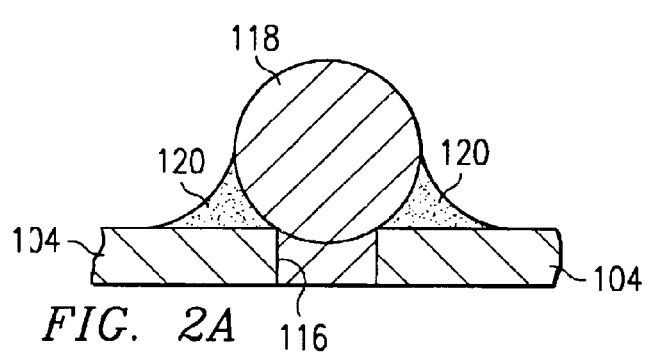
FIG. 2(A) is a cross section and (B) a slanted view showing the shapes of the solder balls and the resin parts of the semiconductor package shown in FIG. 1.
Figure 2B:
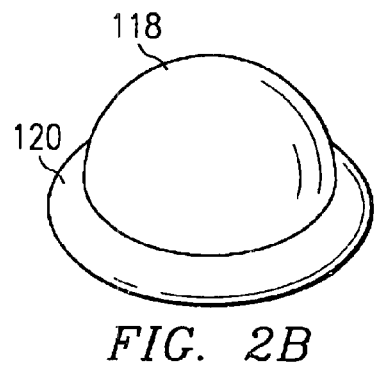

Resin parts 120 made of a heat-curing epoxy resin are formed round solder balls 118. As indicated by the cross section and the oblique view in FIGS. 2(A) and (B), said resin parts 120 are formed in such a way that they surround the outer perimeters of solder balls 118 on the side of insulated substrate 104. Said resin parts 120 are used to fix solder balls 118 securely to insulated substrate 104, so as to reinforce the junctions between solder balls 118 and conductive patterns 110.

Figure 3A:
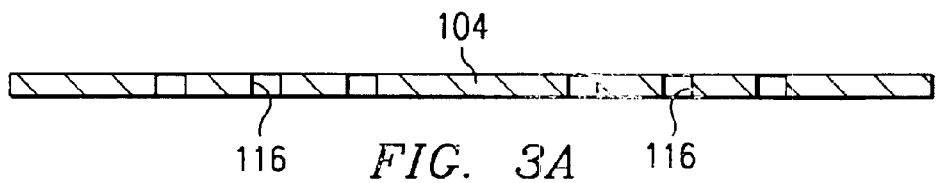
FIG. 3 shows cross sections of the respective manufacturing steps of the semiconductor package shown in FIG. 1.
Figure 3B:
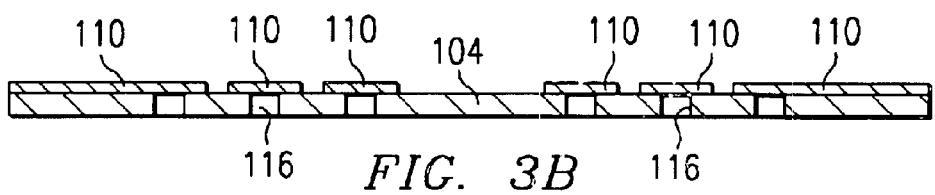
Figure 3C:
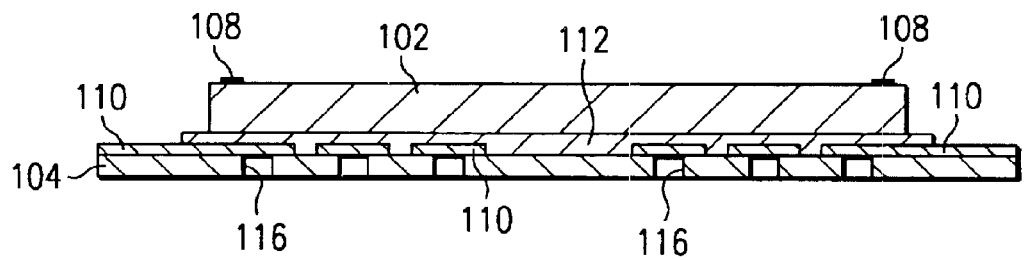
Figure 3D:
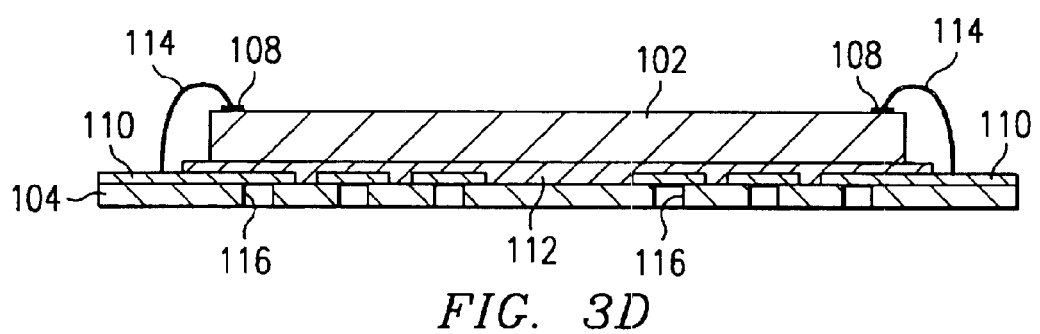
Figure 3E:
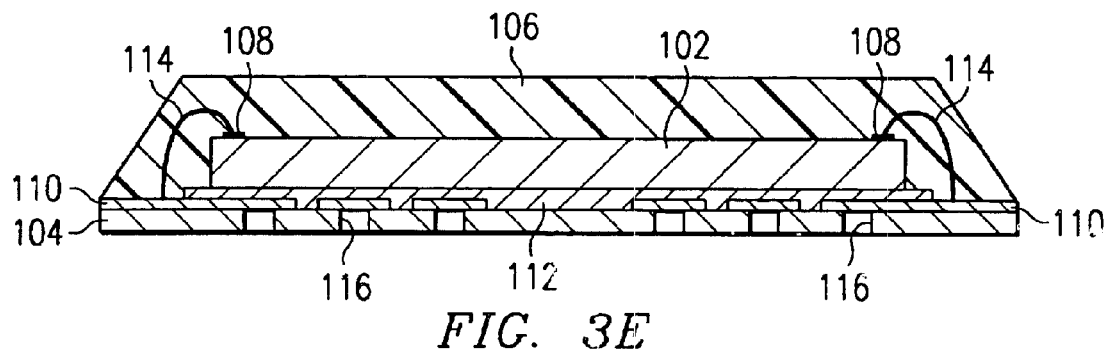

Next, the method for manufacturing semiconductor package 100 pertaining to the present embodiment will be explained. First, as shown in FIG. 3(A), via holes 116 are formed on a polyimide or a ceramic insulated substrate 104 by means of punching or photolithography technique. Then, after a copper foil is laminated over the entire surface of insulated substrate 104, etching is applied using the photolithographic technique in order to form conductive patterns 110 shown in FIG. 3(B). Then, after die paste 112 made of an epoxy type resin is dropped on insulated substrate 104 using a dispenser (not shown), semiconductor chip 102, produced through different processes, is pressed down from above at a fixed pressure, as shown in FIG. 3(C), and die paste 112 is cured by increasing the atmospheric temperature using a heater in order to fix semiconductor chip 102 onto insulated substrate 104. Next, as shown in FIG. 3(D), electrode pads 108 of semiconductor chip 102 and conductive patterns 110 are bonded together using conductive wires 114. After the bonding is completed, semiconductor chip 102 is sealed using sealing material 106 made of a molding resin, as shown in FIG. 3(E).

Figure 4A:
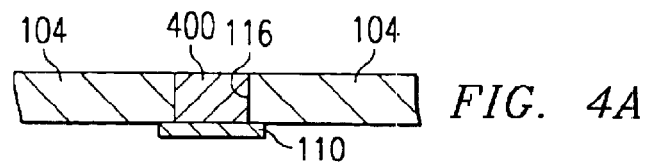
FIG. 4 shows longitudinal cross sections showing the solder ball mounting steps in the semiconductor package manufacturing method of FIG. 3.

Next, as shown in FIG. 4(A), via holes 116 of insulated substrate 104 are filled with conductive paste 400 using a screen printing method, for example. Conductive paste 400 contains an alloy comprising Sn (tin), Ag (silver), and Cu (copper) or an alloy comprising Sn, Pb (lead), and Ag. Conductive paste 400 also contains a heat-curing epoxy resin for forming resin parts 120 and a flux (rosin, a solvent, an activator, etc) for promoting fluidity. Desirable content of the heat-curing epoxy resin in said conductive paste 400 is between 10 wt % and 15 wt %, inclusive. In addition, desirable viscosity of said conductive paste 400 is 173–198 Pa·s.

Figure 4B:
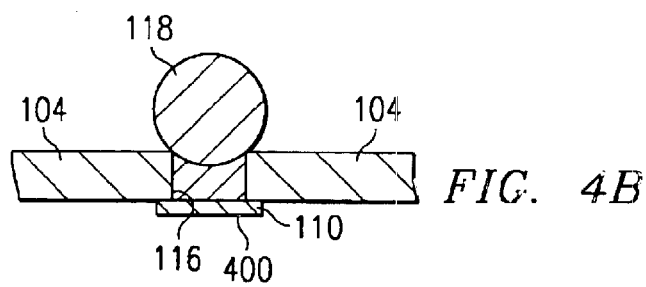
Figure 4C:
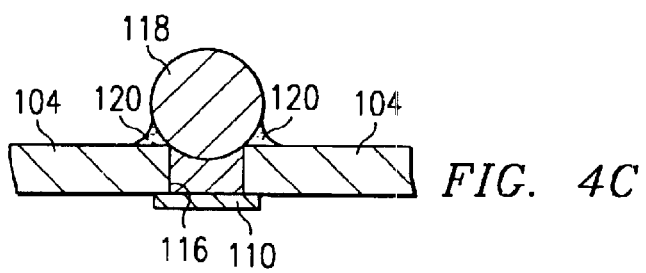

After conductive paste 400 is filled into via holes 116, solder balls 118 are transferred onto conductive paste 400 in via holes 116 as shown in FIG. 4(B), the package is placed in a reflow furnace in order to apply reflow processing (heat treatment for softening the solder). As a result, as shown in FIG. 4(C), the aforementioned alloy element contained in conductive paste 400 becomes integrally joined to solder balls 118 and to conductive patterns 110. On the other hand, the heat-curing epoxy resin contained in conductive paste 400 flows around solder balls 118 to form resin parts 120. Solder balls 118 are attached to the rear surface of insulated substrate 104 in this manner, and resin parts 120 are formed around said solder balls 118. Semiconductor package 100 is completed through the aforementioned steps.

Figure 5A:
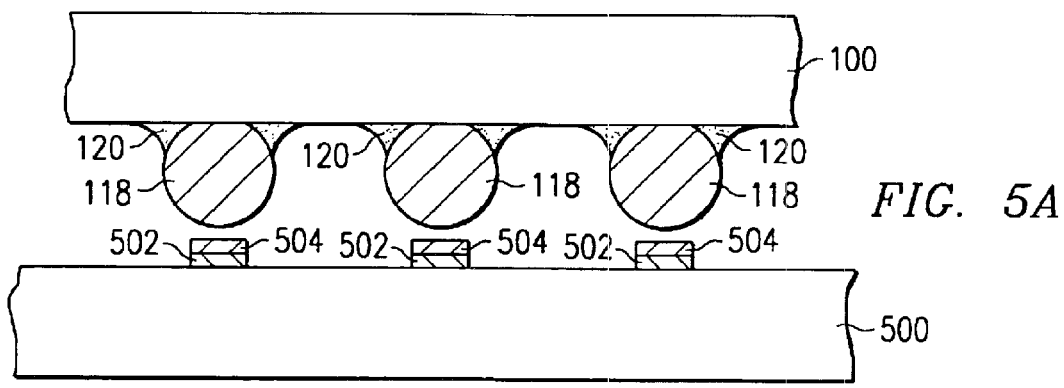
FIG. 5 shows cross sections showing the steps for mounting the semiconductor package shown in FIG. 1 onto the printed-wiring board.
Figure 5B:
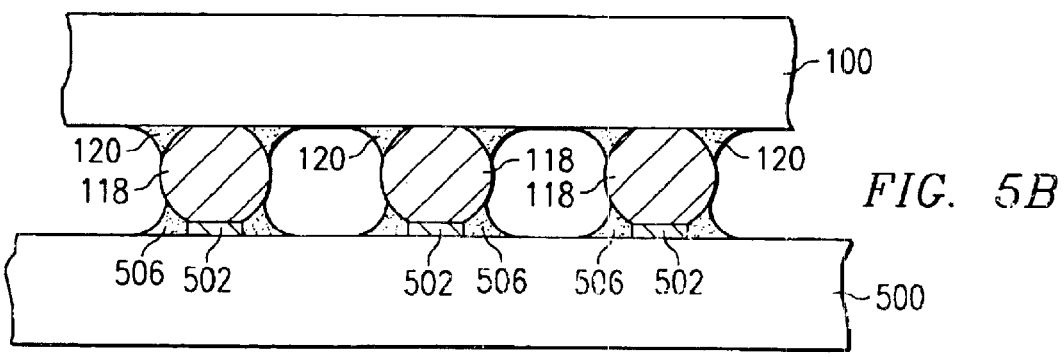

FIG. 5 shows the steps for mounting completed semiconductor package 100 onto printed-wiring board 500, which serves as the motherboard. When mounting semiconductor package 100 onto printed-wiring board 500, conductive paste 504 (one that does not contain the heat-curing epoxy resin may also be used) is printed onto wiring parts 502 of printed-wiring board 500, as shown in FIG. 5(A). Then, as shown in FIG. 5(B), solder balls 118 of semiconductor package 100 are brought into contact with conductive paste 504, and reflow soldering is performed in the reflow furnace. During said reflow soldering, a part of the heat-curing epoxy resin at resin parts 120 of semiconductor package 100 spreads over printed-wiring board 500 to form new resin parts 506 at solder balls 118 on printed-wiring board 500. Junctions between solder balls 118 and wiring parts 502 of printed-wiring board 500 are reinforced by said resin parts 506, so that the connection reliability can be further improved.

As described above, in the case of semiconductor package 100 pertaining to the present embodiment, because the heat-curing epoxy resin is contained in conductive paste 400 in order to form resin parts 120 around solder balls 118, the junctions between solder balls 118 and conductive patterns 110 can be reinforced in order to improve the connection reliability.

Furthermore, because the underfill supplying step to be carried out after semiconductor package 100 is mounted on printed-wiring board 500 can be omitted, the manufacturing process can be simplified. In general, the more densely the solder balls are supplied, the more difficult it becomes to supply the underfill during post-processing. However, in the present embodiment, because the supply of the underfill is no longer needed during post-processing, high connection reliability can be attained regardless of the density of the solder balls.

Furthermore, in the aforementioned embodiment, conductive bumps may also be used in place of conductive wires 114. Here, too, the configuration may be such that the side of electrode pads 108 where semiconductor chip 102 are formed is mounted while facing insulated substrate 104 (so-called face-down), and electrode pads 108 and conductive patterns 110 are connected to each other using the conductive bumps. Thus, the connection reliability can be further improved by forming the conductive bumps using the conductive paste containing the heat-curing epoxy resin.

Figure 6:
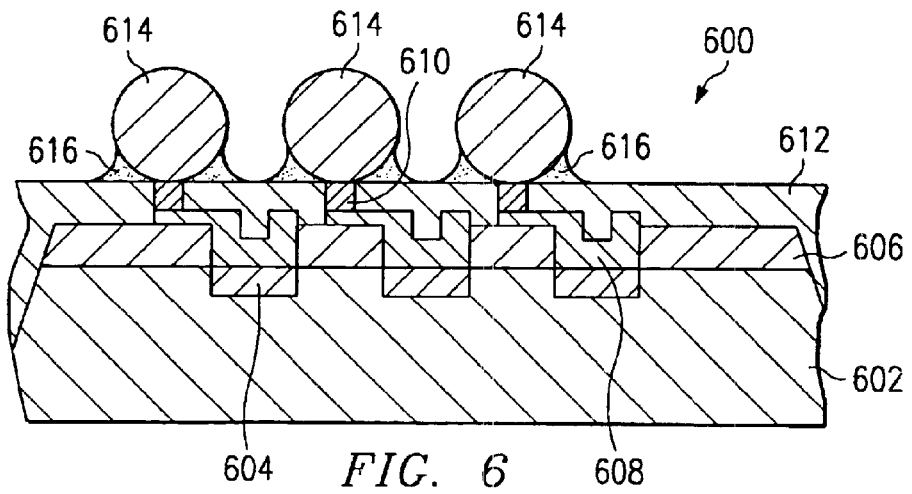
FIG. 6 is a cross section showing the structure of the semiconductor package pertaining to the second embodiment of the present invention.

A second embodiment of the present invention will now be explained. FIG. 6 is a cross section showing the basic configuration of semiconductor package 600 called a wafer-level CSP (Chip Scale Package) pertaining to the present embodiment. Semiconductor package 600 is equipped with semiconductor substrate 602 made of Si. An integrated circuit (not shown) and electrode pads 604 led out from said integrated circuit are formed on the surface of said semiconductor substrate 602. In addition, the surface of said semiconductor substrate 602 is covered with insulating film 606 in order to protect the integrated circuit from external impact. Wires 608 having a 3-layer structure are formed on the surface of insulating film 606. In the figure, wires 608 having a one-layer structure are shown for the sake of simplicity. Wires 608 are connected to aforementioned electrode pads 604 via openings formed on insulating film 606. Connection bumps 610 made of Cu (copper), for example, are formed on the surface of said wires 608. The integrated circuit, insulating film 606, wires 608, and connection bumps 610 of semiconductor substrate 602 are sealed using a sealing material 612 with only the surface of connection bumps 610 exposed. Solder balls 614 are attached to the surface of sealing material 612 while making contact with connection bumps 610.

Resin parts 616 made of heat-curing epoxy resin are formed around solder balls 614. Said resin parts 616 are used to reinforce the junctions between solder balls 614 and connection bumps 610.

Figure 7A:
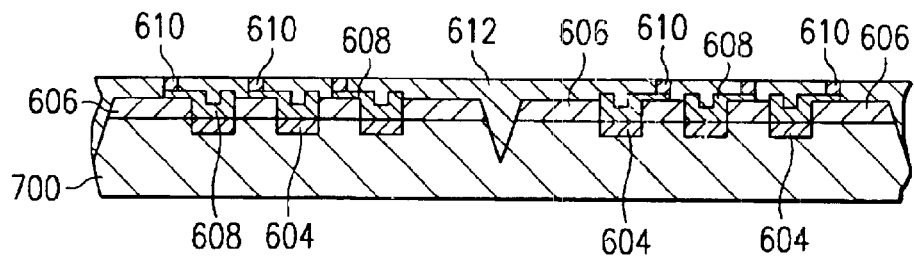
FIG. 7 shows cross sections of the respective steps showing the semiconductor package manufacturing method shown in FIG. 6.

Next, the method for manufacturing the semiconductor package pertaining to the present embodiment will be explained. First, as shown in FIG. 7(A), an integrated circuit (not illustrated) and electrode pads 604 are formed on silicon wafer 700; said surface is covered with insulating film 606; wires 608 having the 3-layer structure are formed on insulating film 606; connection bumps 610 are formed on said wires 608; and the assembly is sealed using sealing material 612. Wires 608 are in contact with electrode pads 604 via opening parts formed on insulating film 606, and the upper surfaces of connection bumps 610 are exposed above sealing material 612.

Figure 7B:
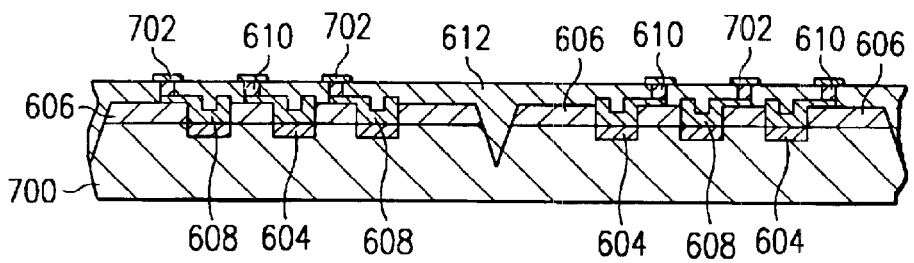
Figure 7C:
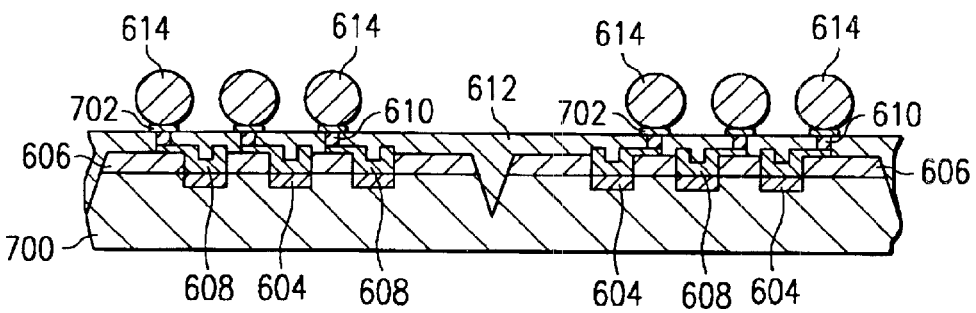
Figure 7D:
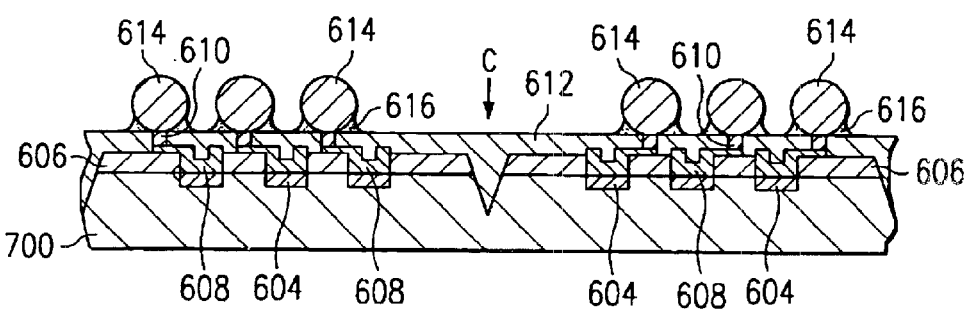

Then, as shown in FIG. 7(B), conductive paste 702 containing the heat-curing epoxy resin is supplied onto the upper surfaces of connection bumps 610 using the screen printing method. Then, as shown in FIG. 7(C), solder balls 614 are transferred onto conductive paste 702 on connection bumps 610 and reflow soldering is performed in the reflow furnace. As shown in FIG. 7(D), solder balls 614 are joined to connection bumps 610 as a result of the reflow. Furthermore, the heat-curing epoxy resin contained in conductive paste 702 forms resin parts 616 around solder balls 614. Finally, semiconductor package 600 is completed by cutting silicon wafer 700 at the position indicated by arrow C in the figure.

Figure 8:
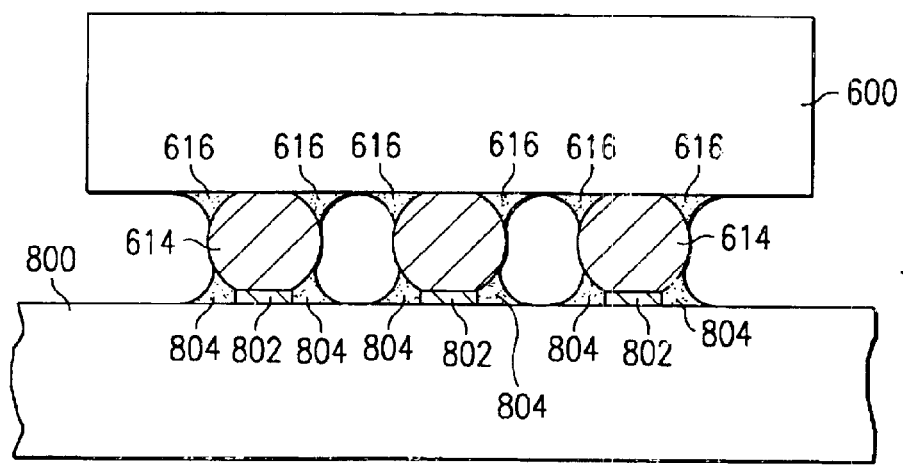
FIG. 8 is a cross section showing the step for mounting semiconductor package shown in FIG. 6 onto the printed-wiring board.

When mounting semiconductor package 600, which was produced in the aforementioned manner, onto printed-wiring board 800 serving as the motherboard, as shown in FIG. 8, a conductive paste (one which does not contain heat-curing epoxy resin may also be used), not shown, is printed onto wires 802 of printed-wiring board 800, solder balls 614 of semiconductor package 600 are brought into contact with said conductive paste, and reflow soldering is performed in the reflow furnace. At this time, a part of heat-curing epoxy resin at resin parts 616 spreads to the side of printed-wiring board 800 to form new resin parts 804 at solder balls 614 on the side of printed-wiring board 800. Junctions between solder balls 614 and wires 802 of printed-wiring board 800 are reinforced by said resin parts 804, so that the connection integrity can be further improved.

In the case of semiconductor package 600 pertaining to the present embodiment, because resin parts 616 are formed around solder balls 614, the junctions between solder balls 614 and connection bumps 610 are reinforced, so that the connection reliability can be improved. Furthermore, because the underfill supplying step to be carried out after semiconductor package 600 is mounted onto printed-wiring board 800 can be omitted, the manufacturing process can be simplified.

Figure 9:
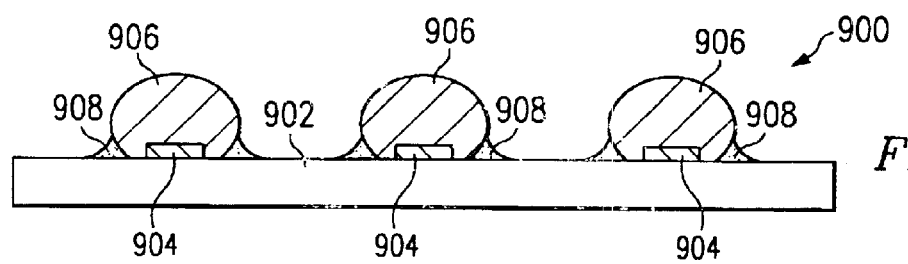
FIG. 9 is a cross section showing the structure of the semiconductor chip pertaining to the third embodiment of the present invention.

Next, a third embodiment of the present invention will be explained. FIG. 9 is a cross section showing the basic configuration of semiconductor chip 900 pertaining to the present embodiment. Said semiconductor chip 900 is called a flip-chip in which the chip is mounted (called bare chip mounting) directly onto the printed-wiring board as is. Said semiconductor chip 900 is equipped with semiconductor substrate 902 made of Si in which an integrated circuit is formed on one side (upper surface of the figure). Electrode pads 904 led out of the integrated circuit are formed on the side of the integrated circuit of semiconductor substrate 902.

Solder bumps 906 are joined to the surfaces of electrode pads 904. Resin parts 908 made up of the heat-curing epoxy resin are formed around said solder bumps 906 on the side of electrode pads 904. Said resin parts 908 are used to reinforce the junctions between solder bumps 906 and electrode pads 904.

Figure 10A:
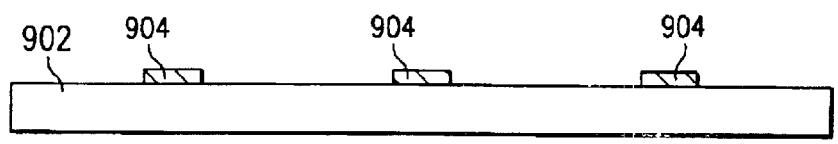
FIG. 10 shows cross sections showing the respective steps for forming the conductive bumps of the semiconductor chip shown in FIG. 9.
Figure 10B:
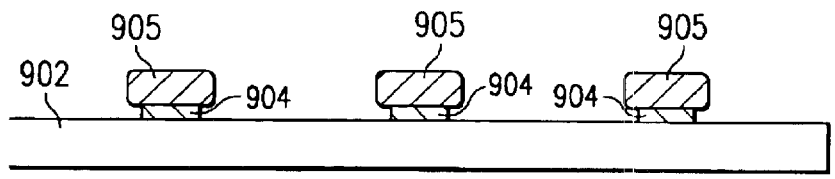
Figure 10C:
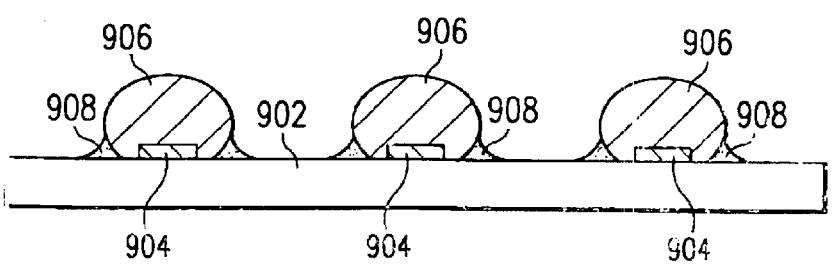

Next, the method for manufacturing semiconductor chip 900 pertaining to the present embodiment will be explained. First, as shown in FIG. 10(A), the integrated circuit is formed on Si semiconductor substrate 902, and electrode pads 904 are led out from said integrated circuit. Then, as shown in FIG. 10(B), conductive paste 905 containing the heat-curing epoxy resin is supplied onto the upper surfaces of electrode pads 904 using the screen printing method. The desired viscosity of conductive paste 905 and the content of the heat-curing epoxy resin are the same as was explained for the first embodiment. Reflow soldering is then applied in the reflow furnace in order to form solder bumps 906 joined to electrode pads 904, as shown in FIG. 10(C). At this time, the heat-curing epoxy resin contained in conductive paste 905 forms resin parts 908 at solder bumps 906 on the side of the substrate. Semiconductor chip 900 is thereby completed.

Figure 11:
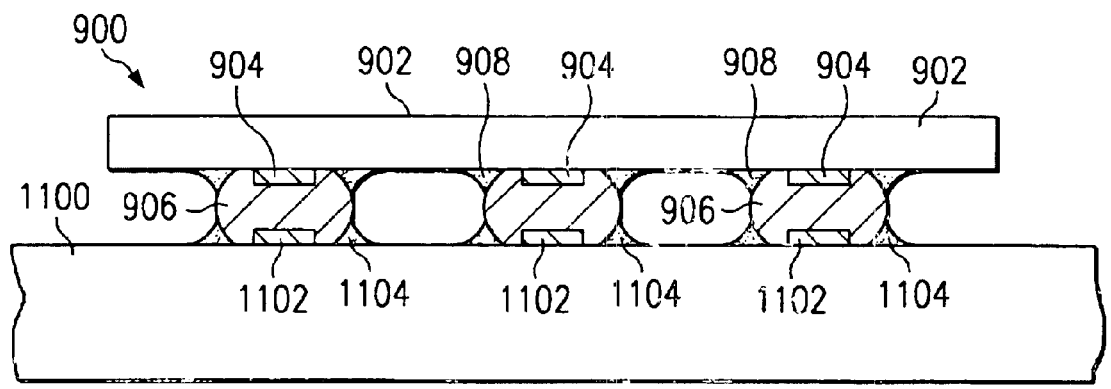
FIG. 11 is a cross section showing the step for mounting the semiconductor chip shown in FIG. 9 onto the printed-wiring board.

As shown in FIG. 11, when said semiconductor chip 900 is mounted on printed-wiring board 1100, which serves as the motherboard, a conductive paste (one which does not contain a heat-curing epoxy resin may also be used), not shown, is applied to wires 1102 of printed-wiring board 1100. Then, semiconductor chip 900 is attached to printed-wiring board 1100 while the side of electrode pads 904 is facing printed-wiring board 1100 (face-down), and the reflow soldering is performed in the reflow furnace. At this time, a part of the heat-curing epoxy resin of resin parts 908 spreads to the side of printed-wiring board 1100 to form new resin parts 1104 at solder bumps 906 on the side of printed-wiring board 1100. The junctions between solder bumps 906 and printed-wiring board 1100 can be reinforced with resin part 1104, so that the connection reliability can be further improved.

In the case of semiconductor chip 900 pertaining to the present embodiment, because resin parts 908 are formed around solder bumps 906, the junctions between solder bumps 906 and electrode pads 904 can be reinforced, so that the connection reliability can be improved. Furthermore, because the underfill supplying step to be carried out after semiconductor chip 900 is mounted on printed-wiring board 1100 can be omitted, the manufacturing process can be simplified.

Furthermore, semiconductor chip 900 pertaining to the present embodiment can also be provided inside of the semiconductor package explained in the first embodiment. In this case, solder bumps 906 of semiconductor chip 900 can be used for internal connection within the semiconductor package.

Application Example

An application example of the first of the aforementioned embodiments will be explained. Here, several semiconductor packages 100 (FIG. 1) having the structure explained in the first embodiment were produced, and a temperature cycle test was conducted after they were mounted onto printed-wiring boards 500 (FIG. 5) serving as motherboards. The temperature cycle test was conducted for the 24 semiconductor packages 100 with respect to each requirement in order to check the poor connection occurrence rate (defect percentage). The relationship between the cycle and the defect percentage is shown in FIG. 12.

In addition, as a comparative example to the present application example, semiconductor packages produced in the same manner as in the aforementioned application— except that the solder balls were mounted using a conductive paste not containing the heat-curing epoxy resin—were mounted on the printed-wiring boards in order to check the defect percentage. The relationship between the cycle and the defect percentage in the comparative example is also shown in FIG. 12.

Figure 12:
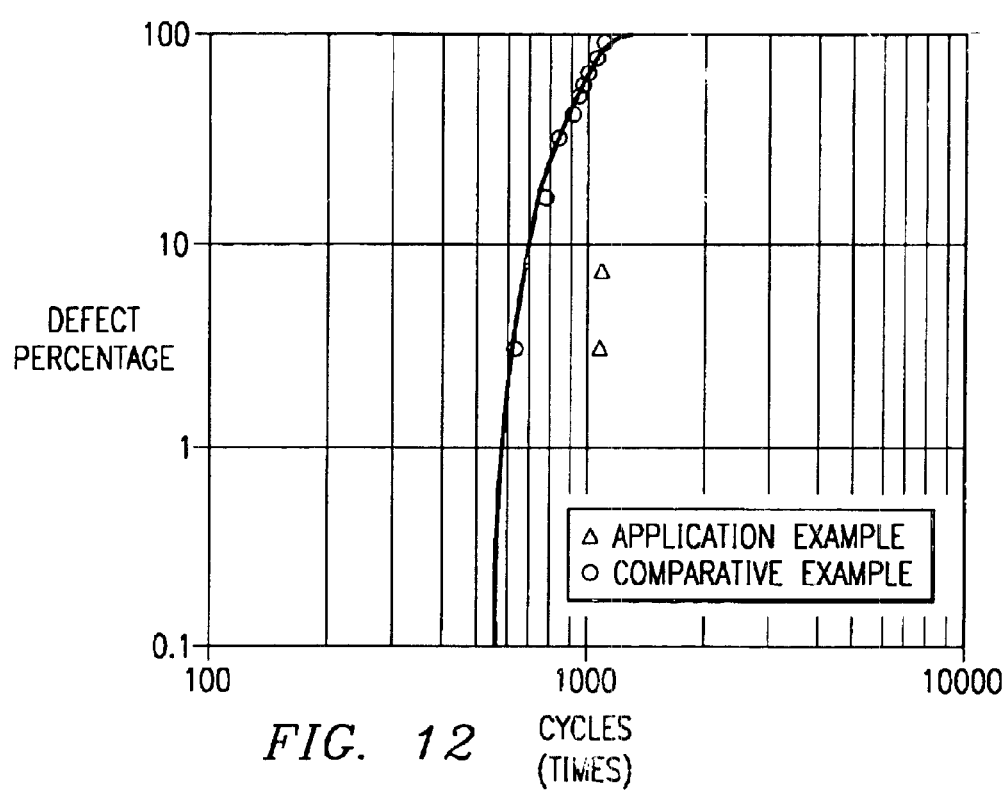
FIG. 12 is a graph showing the results of the measurements of the defective percentage regarding the application example of the first embodiment.

It is clear from FIG. 12 that the occurrence of poor connections is reduced significantly in the present application example relative to the comparative example. For example, while the defect percentage is 2% at around 600 cycles in the comparative example, the same defect percentage, that is 2%, is observed at around 1,000 cycles in the present application example. Thus, it is clear that the connection reliability is dramatically improved in the present application example, relative to the comparative example. Furthermore, the same effect is assumed with respect to the reliability measured using other evaluation methods (for example, mechanical connection reliability versus dropping and bending).

Embodiments of the present invention were explained above with reference to the figures. However, the present invention is not limited to the aforementioned embodiments; needless to say, variations are permitted within the scope of the claims. For example, other conductive substances can be used in place of the aforementioned solder bumps or solder balls.

As described above, in the present invention, because the external connection terminals are formed using the conductive paste containing the heat-curing epoxy resin, and the resin parts are formed around the external connection terminals by the heat-curing epoxy resin, the junctions between the external connection terminals and the insulated substrate can be reinforced in order to improve the connection reliability. In addition, because the underfill supplying step during post-processing can be omitted, the manufacturing process can be simplified.

What is claimed is:

1. A semiconductor device comprising:
    an insulated substrate having a principal surface and an opposing secondary surface, said insulated substrate having multiple via holes extending between the principal and secondary surfaces and multiple conductor patterns in contact with the said via holes on the principal surface of said insulated substrate,
    a semiconductor chip having electrode pads and mounted on the principal surface of said insulated substrate,
    connection elements forming electrical connections between electrode pads of said semiconductor chip and said conductor patterns,
    multiple external connection terminals disposed on the secondary surface of said insulated substrate that correspond to said via holes and connected to said conductor patterns,
    first resin parts disposed on said secondary surface and at the periphery parts of said external connection terminals using a heat-curing epoxy resin;
    a wiring board having wiring parts thereon, said external connection terminals contacting said wiring parts; and
    second resin parts disposed on said wiring board and at the periphery parts of said external connection terminals.
2. The semiconductor device of claim 1 in which said external connection terminals are conductive balls.
3. A method for manufacturing a semiconductor device comprising the steps of:

providing an insulated substrate having a principal surface and a secondary surface, said insulated substrate having multiple via holes for providing external connection terminals and multiple conductive patterns in contact with said via holes on the principal surface side, mounting a semiconductor chip having electrode pads on the principal surface side of said insulated substrate, and forming electrical connections between the electrode pads of said semiconductor chip and said conductive patterns, applying a conductive paste containing a heat-curing epoxy resin to said via holes, applying external connection terminals to said via holes at the secondary surface; and forming resin parts at the periphery parts of the external connection terminals on said secondary surface using the heat-curing epoxy resin contained in said conductive paste.

4. The method for manufacturing a semiconductor device of claim 3 further comprising the step of moving conductive balls serving as said external connection terminals onto said conductive paste, wherein said resin parts are formed at the periphery parts of said conductive balls.

5. The method for manufacturing a semiconductor device of one of claim 3 in which the content of the heat-curing epoxy resin of said conductive paste is between 10 wt % and 15 wt %, inclusive.

6. The method for manufacturing a semiconductor device of one of claim 4 in which the content of the heat-curing epoxy resin of said conductive paste is between 10 wt % and 15 wt %, inclusive.

7. A method for manufacturing a semiconductor device comprising the steps of:

providing a semiconductor chip having an electronic circuit and electrode pads on a surface of said semiconductor chip, applying a conductive paste containing a heat-curing epoxy resin to said electrode pads; and forming electrical connections with said electrode pads by applying external connection terminals to said electrode pads through said conductive paste to form resin parts at the periphery parts of the external connection terminals using the heat-curing epoxy resin contained in said conductive paste;

in which the content of the heat-curing epoxy resin of said conductive paste is between 10 wt % and 15 wt %, inclusive.

8. A method for manufacturing a semiconductor device comprising the steps of:

providing a semiconductor chip having an electronic circuit and electrode pads on a surface of said semiconductor chip, applying a conductive paste containing a heat-curing epoxy resin to said electrode pads; and forming electrical connections with said electrode pads by applying external connection terminals to said electrode pads through said conductive paste to form resin parts at the periphery parts of the external connection terminals using the heat-curing epoxy resin contained in said conductive paste;

further including the step of providing a wiring board having wiring parts thereon;

contacting said external connection terminals and said wiring parts; and disposing second resin parts on said wiring board and at the periphery parts of said external connection terminals.

9. The method of claim 3 wherein said step of applying external connection terminals to said via holes at the secondary surface causes at least some of said heat conducting epoxy resin to exit said via holes and to form said resin parts at the periphery parts of the external connection terminals on said secondary surface.

* * * * *